United States Patent [19]

Eck et al.

[11] Patent Number: 5,065,130
[45] Date of Patent: Nov. 12, 1991

[54] HIGH SENSITIVITY CORBINO DISK MAGNETORESISTOR ARRAY

[75] Inventors: Robert E. Eck, Goleta, Calif.; Thaddeus Schroeder, Rochester Hills, Mich.

[73] Assignees: Santa Barbara Research Center, Goleta, Calif.; General Motors Corporation, Detroit, Mich.

[21] Appl. No.: 489,580

[22] Filed: Mar. 7, 1990

[51] Int. Cl.$^5$ .............................................. H01L 43/00
[52] U.S. Cl. ................................................. 338/32 R
[58] Field of Search ............... 338/32 R, 32 H; 357/1, 357/2, 3, 4, 26, 27; 364/847; 307/309; 360/113; 365/158, 173

[56] References Cited

U.S. PATENT DOCUMENTS

| 3,617,975 | 11/1971 | Wieder | 338/32 R |
| 3,840,728 | 10/1974 | Kataoka | 364/847 |
| 4,296,424 | 10/1981 | Shibasaki et al. | 357/1 |

OTHER PUBLICATIONS

"Van Nostrand's Scientific Encyclopedia", 7th edition, ed. by D. M. Considine, Van Nostrand Reinhold, 1989, p. 1398.
C. W. Wang et al., "Semiconductive Magnetoresistors", MRL Bulletin of Research and Development, vol. 2, No. 2, Sep. 1988.
Physikalische Zeitschrift, 15 Juli 1911, 12. Jahrgang., "Elektromagnetische Effekte, die von der Verzerrung herrühren, welche ein Feld an der Bahn der Ionen in Metallen hervorbringt", Corbino, Von O. M., pp. 561-58, No. 14.

Primary Examiner—Marvin M. Lateef
Attorney, Agent, or Firm—W. C. Schubert; W. K. Denson-Low

[57] ABSTRACT

An array of Corbino disks are connected in series to provide a high sensitivity magnetoresistor device with a total resistance determined by the number of disks in the array and their geometries. Each Corbino disk has a hub terminal on a layer of magnetoresistor material, and a surrounding conductive shorting ring. The disks are connected in an alternating series connected with alternate inter-disk connections made between the hub terminals of successive disks, and the intermediate inter-disk connections made between the shorting rings of successive disks. Current flow through the array thus alternates between hub terminal-to-shorting ring and shorting ring-to-hub terminal for successive disks. The disks are preferably provided in pairs on mutually isolated islands, with the shorting rings and hub terminals on opposite surfaces on the disks. The shorting rings for each disk pair intersect generally tangentially to electrically connect the disks, while connections between successive disks on successive islands are made by leads running along the substrate between the hub terminals for those disks.

15 Claims, 3 Drawing Sheets

HIGH SENSITIVITY CORBINO DISK MAGNETORESISTOR ARRAY

RELATED APPLICATION

This application is related to pending U.S. Pat. Application Ser. No. 490,034, filed Mar. 7, 1990, by Robert Eck and Ronald Hoendervoogt, "Magnetoresistor Structure and Operating Method", assigned to Santa Barbara Research Center

BACKGROUND OF THE INVENTION

1. Field of the Invention

This invention relates to magnetoresistors, and more particularly to Corbino disk devices.

2. Description of the Related Art

Magnetoresistors exhibit a resistance which varies in accordance with an applied vertical magnetic field. Most magnetoresistors exhibit positive magnetoresistance, with the resistance increasing in response to increases in magnetic field strength. The basis of the magnetoresistance is the Lorentz force, which causes the electrons to move in curved paths between collisions. This increases the effective electron path length, and is reflected as an increase in resistance.

As the electrons are reflected towards one side of the magnetoresistor (MR), the accumulation of electrons along that side produces an internal transverse electric field which opposes and tends to negate the effect of the externally applied magnetic field. This phenomenon is referred to as the Hall effect, and is described for example in Van Nostrand's Scientific Encyclopedia, 7th Edition, ed. by D. M. Considine, Van Nostrand Reinhold, 1989, page 1398.

By shorting the Hall electric field, one can obtain a magnetoresistance which does not saturate. One approach to accomplishing this shorting effect is to form a pattern of transverse shorting strips across an elongate MR bar. The conductive shorting strips form contacts with the underlying MR material, and in effect short circuit the Hall fields that would otherwise be built up. Examples of such Hall shorting strips are given in Wang et al., "Semiconductive Magnetoresistors", MRL Bulletin of Research and Development, Vol. 2, No. 2, September 1988, and in U.S. Pat. Nos. 3,772,100, 3,852,103 and 3,898,359.

Another approach to eliminating the Hall field is to choose an MR geometry such that the field does not exist. A Corbino disk is a well-known device of this type. Corbino disks are circular disks of MR material, with a conductive terminal at the hub or center of the disk, and a conductive ring encircling the hub terminal. The ring and hub terminal are formed on the same side of the disk, or can extend through the disk. The circularly symmetric configuration of the conductive ring perpendicular to the current flow prevents any local accumulations of charge, and thereby inhibits the development of a Hall field. Corbino disks are discussed, for example, in H.H. Wieder, "Hall Generators and Magnetoresistors", Pion Ltd., 1970, pages 1-6.

While Corbino disks tend to be more sensitive than elongate MR bars for a given area, MR bars have the advantage that they have layout flexibility. For example, long linear MRs can be designed with their total resistance easily selected by choosing appropriate dimensions for the bar. For certain applications, such as in automobiles where high accuracy is required and operating temperatures can reach 240° C., a greater degree of sensitivity than that provided by either of the present devices would be desirable, but it would still be useful to be able to easily tailor the dimensions of the MR device to adjust its total resistance and to provide a layout that fits the requirement.

SUMMARY OF THE INVENTION

The present invention provides a new MR structure which has a higher degree of magnetic field sensitivity than prior devices, is expandable in length to permit a convenient selection of total resistance and layout, and is practical to fabricate.

The new device consists of an array of Corbino disks, each disk having a hub terminal and a surrounding shorting ring on a layer of MR material. The disks are connected together in series in an alternating configuration, with the current flowing outward from the hub terminal to the shorting disk for one ring, inward from the shorting ring to the hub terminal for the next disk, outward from the hub terminal to the shorting ring for the following disk, and so on. By placing the hub terminals and shorting rings on opposite sides of the MR layer, inter-disk connections can be made without crossing over from one side of the MR layer to the other, thereby making possible a reliable fabrication process. Alternately, the array of Corbino disks can be fabricated with all contacts on the top of the MR material, with the leads connecting the hub terminals crossing over the shorting rings, and an insulating material providing the required isolation; this latter configuration would be appropriate for a deposited film of the MR material.

The disks are preferably arranged in pairs, with each pair sharing an island that is isolated from the islands for the other pairs on a dielectric substrate. The shorting rings of the two disks on each island are connected together generally tangentially, while the hub terminals for successive disks on successive islands are connected by leads along the substrate. The chain of islands can be extended to any desired length to provide a particular total resistance and layout.

These and other features and advantages of the invention will be apparent to those skilled in the art from the following detailed description of preferred embodiments, taken together with the accompanying drawings, in which:

DETAILED DESCRIPTION OF THE INVENTION

Figure 1:
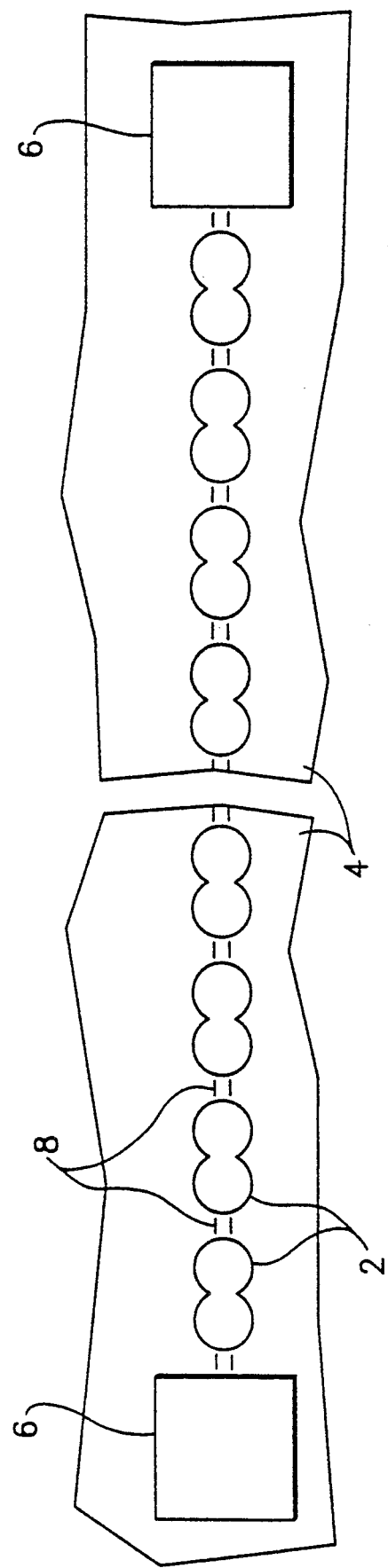
FIG. 1 is a simplified plan view of a Corbino disk array constructed in accordance with the invention.

A simplified view of one embodiment of the invention is given in FIG. 1. An array of Corbino disk islands 2 is formed on a dielectric substrate 4 which is capable of transmitting a magnetic flux. Sapphire is preferred for the substrate because of its rigidity. Oxide coated silicon, quartz or ceramics are other candidates for the substrate material. The islands 2 are arranged in a series circuit, with the terminal islands connected to respective contact pads 6 to provide access for external electrical connections. Although illustrated as a simple linear array, the islands 2 may be arranged in a serpentine configuration to obtain a greater chain length for a given substrate area, or in any other desired geometric arrangement.

Each island 2 contains a pair of electrically connected Corbino disks, and the successive disks of adjacent islands are connected by leads 8 along the substrate. The result is a series connection of Corbino disks between the opposite contact pad 6. The total resistance of the array is the sum of the resistances associated with each of the individual Corbino disks (ignoring lead resistances), while the sensitivity is considerably greater than for either a single Corbino disk, or an MR bar with shorting strips, having the same total resistance.

Figure 2:
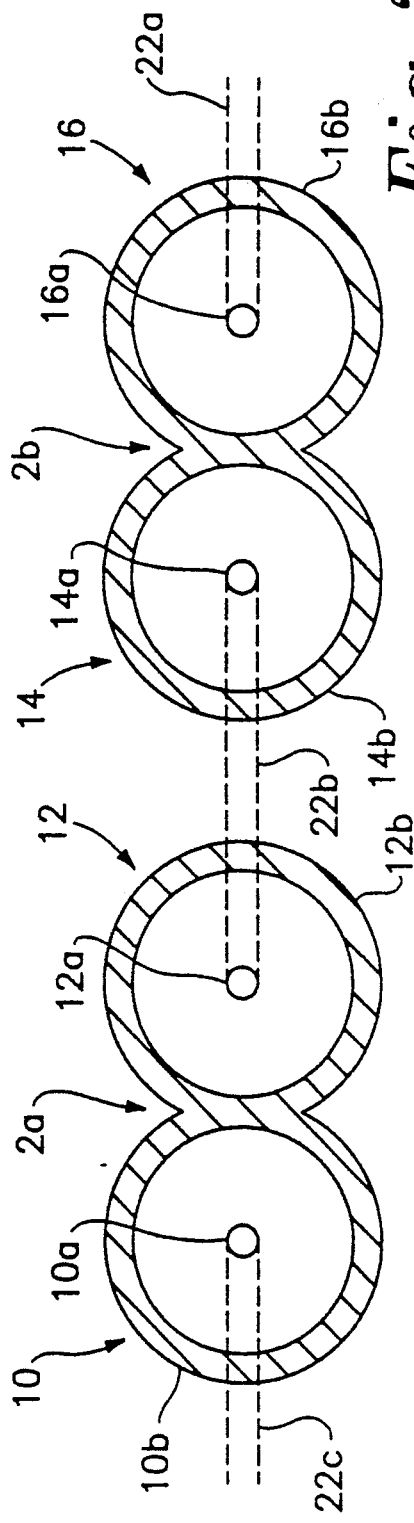
FIG. 2 is a fragmentary plan view of a portion of the array, showing details of the Corbino disks.
Figure 3:
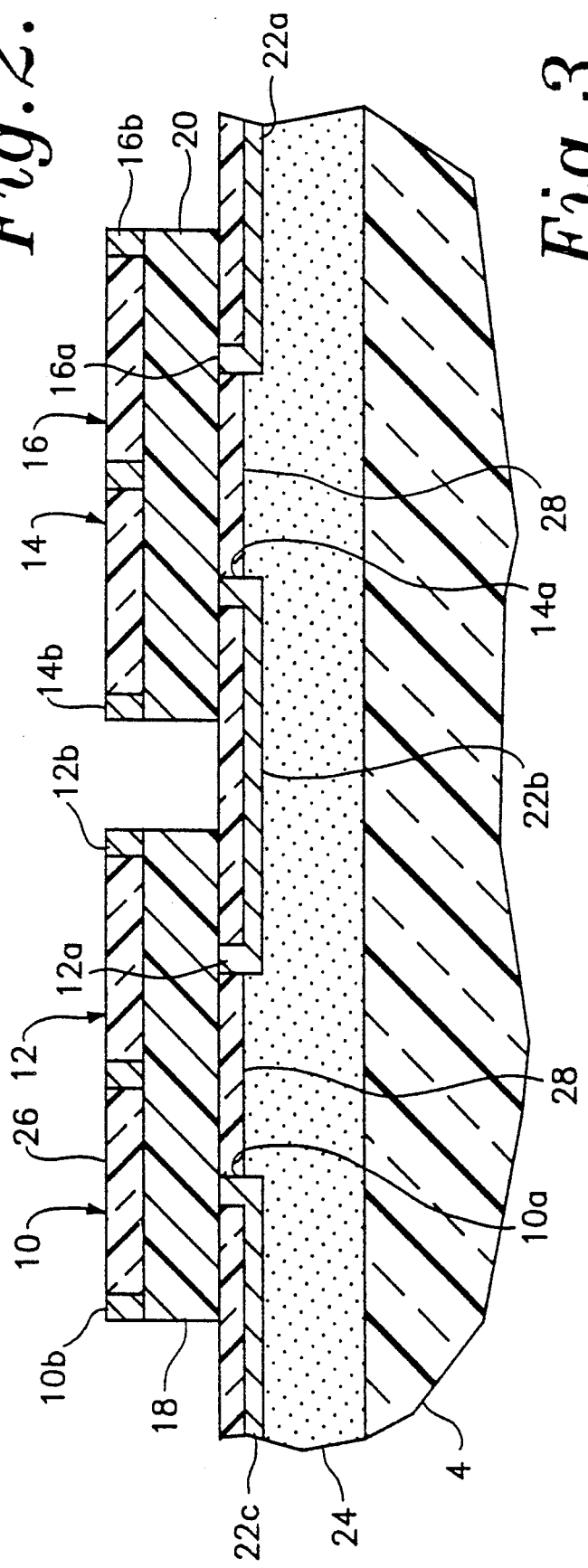
FIG. 3 is a sectional view of the Corbino disk structure shown in FIG. 2.

Details of the islands and their Corbino disks are shown in FIGS. 2 and 3. Two islands are shown, designated by numerals 2a and 2b. Each island is formed by a pair of Corbino disks, designated 10 and 12 for island 2a and 14 and 16 for island 2b. Corbino disks 10 and 12 share a layer of MR material 18, while disks 14 and 16 share a coplanar layer of MR material 20. Bulk indium antimonium is the preferred MR material, but other materials such as indium arsenide, indium phosphide and gallium arsenide might also be used. The MR layer forming the islands is generally about 1-10 microns thick. The Corbino disks 10, 12, 14, 16 include respective hub terminals 10a, 12a, 14a, 16a formed from a conductive material centrally located on the underside of each disk, and respective conductive shorting rings 10b, 12b, 14b, 16b surrounding the hub terminal on the upper surfaces of the disks. The positioning of the hub terminals and shorting rings on opposite sides of the disks is a unique configuration that is very helpful in achieving reliable inter-disk connections, as described below.

The shorting rings for the pair of Corbino disks sharing each island physically and electrically merge generally tangentially, thereby giving the islands FIG. 8 shapes. The two disks on each island are thus connected in series at their shorting rings.

Series connections between successive disks in the array on adjacent islands are made by means of conductive leads 22 along the substrate between the hub terminals of successive disks. For example, the hub terminals 12a and 14a of Corbino disks 12 and 14 are connected by a lead 22a; the hub terminal 16a of Corbino disk 16 is connected to the hub terminal for the previous disk in the series circuit (not shown) by means of another lead 22b, while the hub terminal 10a for Corbino disk 10 is connected to the hub terminal of the next Corbino disk in series (not shown) by a third lead 22c.

The Corbino disk structure is attached to the substrate by an epoxy glue 24, which may be considered as part of the substrate to provide consistent terminology for this disclosure. The epoxy layer should be kept as thin as possible consistent with good adherence, and is generally about 0.5-8 microns thick.

To prevent the accumulation of surface charge which might short out the Corbino disks, the upper and lower disk surfaces are coated with passivating layers 26 and 28, respectively. The lower passivating layer 28 also insulates the undersides of the Corbino disks around the hub terminals from the inter-disk leads 22. The employment of passivating layers in an MR structure is discussed in further detail in the related patent application referenced at the beginning of this disclosure. The passivation layers are ideally pure $SiO_2$, deposited by chemical vapor deposition. In practice, some SiO will also enter the passivation layers, so that the layers are actually a combination of the two which can be designated $SiO_x$. Alternately, SiN can be used for the passivation. The layers are preferably on the order of 0.1 micron thick.

The operation of the series circuit of Corbino disks is best understood with reference to FIG. 3. Assuming that current has been applied to the array from the right hand side and is travelling towards the left, current will enter right hand Corbino disk 16 along its respective lead 22a and hub terminal 16a. From there it will radiate out through the MR material 20 to the surrounding shorting ring 16b. In the absence of a vertical magnetic field, the current will flow generally along radial lines to the shorting ring. If a magnetic field is applied, the current flow will bend in pinwheel fashion, thereby increasing the electron path length and the effective resistance of the device. In this manner the magnetic field strength can be perceived as a function of the resistance offered by the Corbino disk array.

Continuing with the current flow through the series circuit, current from the shorting ring 16b for Corbino disk 16 flows into the adjacent and touching shorting ring 14b for Corbino disk 14, and from there through the MR material to the hub terminal 14a for disk 14. The current then travels to the hub terminal 12a for disk 12 over lead 22b, outward through the MR layer 18 to the shorting ring 12b for disk 12, and then into shorting ring 10b for disk 10, inward through MR layer 18 to the hub terminal 10a for disk 10, and finally outward to the left through lead 22c. Thus, the current flow for successive Corbino disks alternates between hub terminal-to-shorting ring and shorting ring-to-hub terminal.

Figure 5:
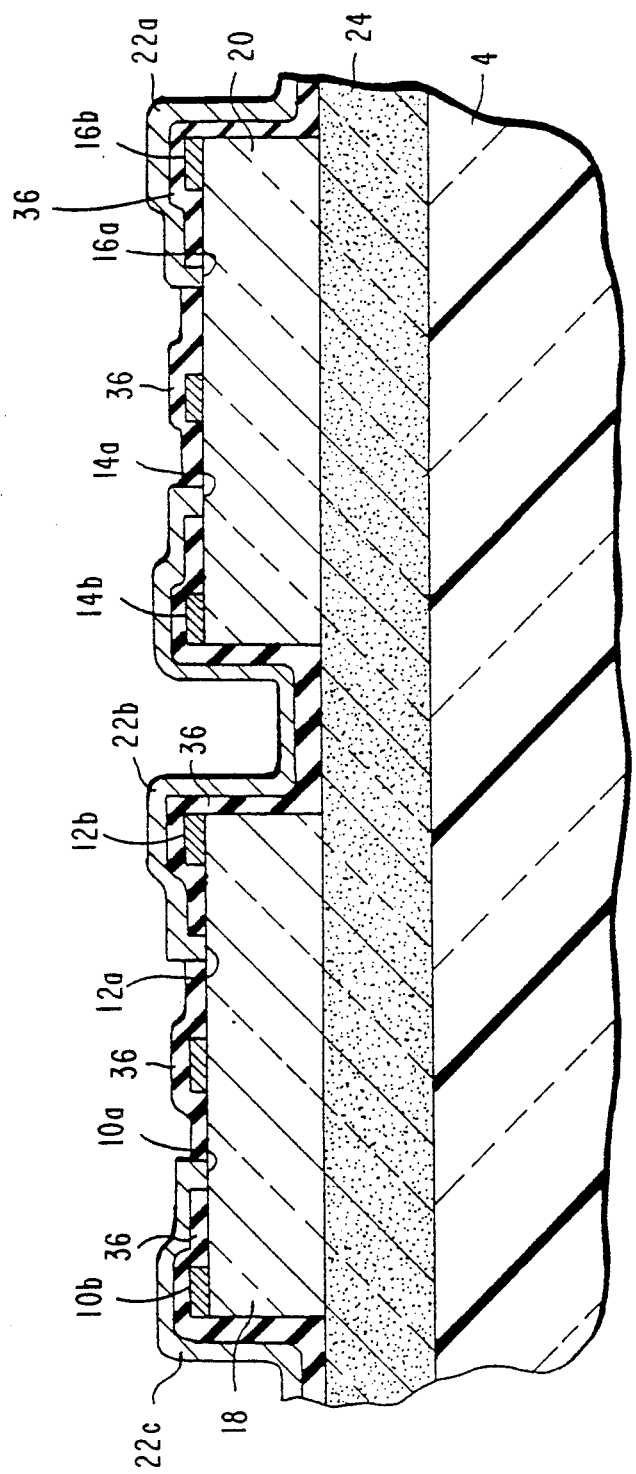
FIG. 5 is a sectional view of an alternate Corbino disk structure with the invention.

One important aspect of the configuration shown in FIGS. 2 and 3 is that it avoids any connections between successive Corbino disks that have to go across an edge of the MR material to travel between upper and lower disk surfaces. An alternate implementation of the invention, shown in FIG. 5, uses edge traversing leads. This embodiment is suitable for Corbino rings in which the MR material is a deposited film, which can be a single crystal material but does not have to be. Elements which are the same as or functionally equivalent to elements of the previous figures are indicated by the same reference numerals. In FIG. 5 all of the contacts are disposed above the MR material, with the leads 22a, 22b, 22c which connect the successive hub terminals 10a, 12a, 14a, 16a crossing over the shorting rings 10b, 12b, 14b, 16b. An insulating layer 36 formed from a material such as $SiO_2$ or SiN separates the leads from the shorting rings. The current flow through the MR material is essentially the same as in the embodiment of FIGS. 2 and 3.

Figure 4:
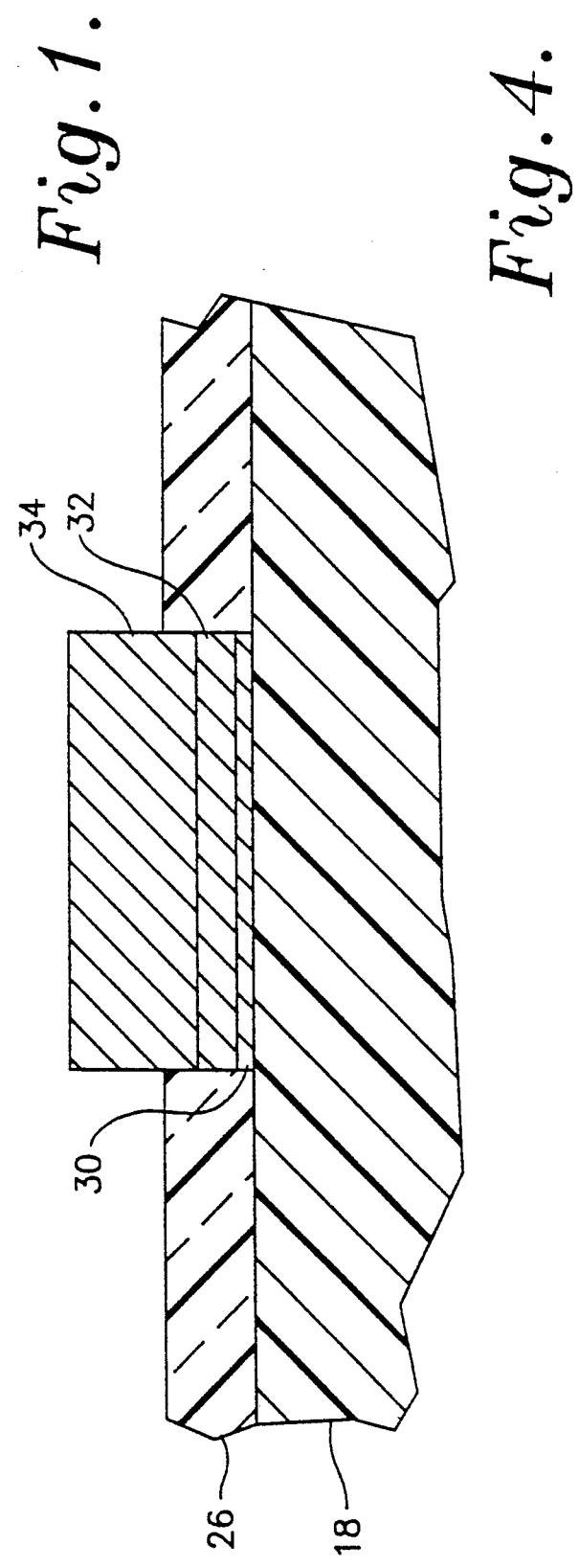
FIG. 4 is a fragmentary sectional view showing a multilayer preferably used for the Corbino disk and shorting rings.

FIG. 4 illustrates a preferred implementation for the shorting rings, shown in section. The preferred construction provides a shorting ring that is securely adhered to the underlying MR material, does not diffuse into that material, and provides a very low resistance path. This type of construction is discussed in further detail in the related application referenced above.

The shorting ring includes a thin layer of an ohmic contact material 30 in direct contact with the upper surface of the MR material 18. The material 30 should be selected to provide a good ohmic contact with the underlying MR material, and to not diffuse into that material. Palladium is preferred for this purpose in connection with an indium antimonium MR, but nickel or platinum could also be used. The ohmic contact layer 30 can be electroplated onto the MR structure to a preferred thickness of about 200 Angstroms.

A blocking layer 32 is formed over the ohmic contact layer 30, followed by the deposit of a conductive layer 34 on top of the blocking layer 32, preferably by evaporation. The blocking layer material is selected to obtain a good adhesion for the conducting layer, and to block the conducting layer material from diffusing into the MR material. For a conducting layer formed from gold or aluminum, either titanium or nickel could be used for the blocking layer 32. If it is kept thin enough, preferably to a thickness of about 600–800 Angstroms in conjunction with an ohmic contact layer about 200 Angstroms thick, the blocking layer will not be easily removed and will assure a good adhesion of the shorting ring to the MR material. The blocking layer can be deposited by vacuum deposition.

Gold is the preferred material at present for the conductive layer 34. The conductive layer is made thick enough to offer a very low resistance around the ring. However, care should be taken that the conductive layer is not so thick as to create a tendency to be peeled off. A gold layer with a thickness in the approximate range of 0.5–1.5 microns, and preferably about 0.6–1.0 microns, has been found to satisfy these criteria. In addition to being a good conductor, gold has the advantage of being malleable enough to avoid unduly stressing as it heats. Aluminum might be used as a substitute for gold, since it can be fabricated thick enough to bond to the MR structure, but not so thick as to cause significant thermal expansion problems. Indium is another candidate conductor material, but is limited to relatively low temperatures since it melts above about 150° C.

The hub terminals and inter-disk leads 22 on the underside of the Corbino disks are also preferably constructed with the same type of metallization as the shorting rings, although this is not as critical for these elements since they are prevented from peeling off by the overlying MR disks and passivation layer 28.

While an illustrative embodiment of the invention has been shown and described, numerous variations and alternate embodiments will occur to those skilled in the art without departing from the spirit and scope of the invention. For example, separate Corbino disks could be provided on individual islands, or if provided in pairs could be spaced apart with their shorting rings connected by leads. The Corbino disks could also be inverted from the orientation shown in FIG. 3, with the shorting rings along the substrate and the hub terminals on top. Other Corbino disk geometries could also be envisioned, although the circular geometry described gives maximum symmetry. Accordingly, it is intended that within the scope of the appended claims, the present invention may be practiced otherwise than as specifically described.

We claim:

1. A high sensitivity magnetoresistor (MR) structure, comprising:
    an array of Corbino disks, each disk comprising a layer of MR material, a hub terminal on the MR material, and a conductive shorting ring on the MR material surrounding the hub terminal,
    said disks being connected in an alternating series connection with alternate inter-disk connections made between the hub terminals of successive disks, and intermediate inter-disk connections between said hub terminal connections made between the shorting rings of successive disks, whereby current flow through the array alternates between hub terminal-to-shorting ring and shorting ring-to-hub terminal for successive disks.

2. The MR structure of claim 1, wherein said shorting rings and hub terminals are formed on opposite sides of their respective disks.

3. The MR structure of claim 2, wherein said disks are provided in pairs on mutually isolated islands of MR material arranged on a common substrate, the disks having connected shorting rings share common islands, and said alternate inter-disk connections are provided by electrically conductive leads along the substrate connecting the hub terminals of successive disks on successive islands.

4. The MR structure of claim 3, wherein each pair of disks sharing a common island have shorting rings that intersect generally tangentially to form said intermediate inter-disk connections.

5. The MR structure of claim 1, wherein said shorting rings and hub terminals are formed on the same side of their respective disks, and further comprising insulating means between said alternate inter-disk connections and the shorting rings of the disks they connect.

6. A high sensitivity magnetoresistor (MR) structure, comprising:
    an array of Corbino disks, each disk comprising a layer of MR material, a hub terminal on the MR material, and a conductive shorting ring on the MR material surrounding the hub terminal,
    said disks being connected in an alternating series succession with the hub terminals of alternate disks being electrically connected to the hub terminal of the next respective disk in succession, and the shorting rings of said next respective disks in succession being electrically connected to the shorting ring of the following respective disks in succession.

7. The MR structure of claim 6, wherein said shorting rings and hub terminals are formed on opposite sides of their respective disks.

8. The MR structure of claim 7, wherein said disks are provided in pairs on mutually isolated islands of MR material arranged on a common substrate, the disks having connected shorting rings share common islands, and said connections between disk hub terminals are provided by electrically conductive leads along the substrate connecting the hub terminals of successive disks on successive islands.

9. The MR structure of claim 8, wherein each pair of disks sharing a common island have shorting rings that intersect generally tangentially.

10. The MR structure of claim 6, wherein said shorting rings and hub terminals are formed on the same side of their respective disks, and further comprising means insulating said electrical connections between the hub terminals of alternate disks from the shorting rings of the disks they connect.

11. A high sensitivity magnetoresistor (MR) structure, comprising:
    a planar array of Corbino disks, each disk comprising a layer of MR material, a conductive hub terminal on one side of the layer, and a conductive shorting ring surrounding the hub terminal on the opposite side of the layer, said disks being electrically connected in series, alternate ones of said series connections being established by connections between the hub terminals of successive disks along said one side of the disk layers, and the intermediate series connections between said hub terminal connections being established by connections between the shorting rings of successive disks along said opposite side of the disk layer, whereby the full series connection of successive disks is established without a crossing over of inter-disk connections between opposite sides of said disk layers.

12. The MR structure of claim 11, wherein said disks are provided in pairs on mutually isolated islands of MR material arranged on a common substrate, the disks having connected shorting rings share common islands, and said alternate series connections are provided by electrically conductive leads along the substrate connecting the hub terminals of successive disks on successive islands.

13. The MR structure of claim 12, wherein each pair of disks sharing a common island have shorting rings that intersect generally tangentially to form said intermediate series connections.

14. A Corbino disk magnetoresistor (MR), comprising:
a layer of MR material,
a conductive hub terminal on one side of said layer, and
a conductive shorting ring surrounding the hub terminal on the opposite side of said layer.

15. The Corbino disk of claim 14, wherein said hub terminal and shorting ring are disposed on opposite surfaces of said MR layer.

* * * * *